US006261044B1

(12) United States Patent
Fosnight et al.

(10) Patent No.: US 6,261,044 B1
(45) Date of Patent: Jul. 17, 2001

(54) POD TO PORT DOOR RETENTION AND EVACUATION SYSTEM

(75) Inventors: William J. Fosnight; Joshua W. Shenk, both of Austin, TX (US)

(73) Assignee: Asyst Technologies, Inc., Fremont, CA (US)

(*) Notice: Subject to any disclaimer, the term of this patent is extended or adjusted under 35 U.S.C. 154(b) by 0 days.

(21) Appl. No.: 09/130,254

(22) Filed: Aug. 6, 1998

(51) Int. Cl.[7] ................................................. B65G 49/07
(52) U.S. Cl. ........................ 414/217; 414/411; 414/939; 414/940
(58) Field of Search .................................. 414/217, 411, 414/939, 940

(56) References Cited

U.S. PATENT DOCUMENTS

| | | | |
|---|---|---|---|
| 4,674,939 | * 6/1987 | Maney et al. | 414/411 X |
| 4,995,430 | * 2/1991 | Bonora et al. | 414/940 X |
| 5,433,574 | * 7/1995 | Kawano et al. | 414/940 X |
| 5,547,328 | * 8/1996 | Bonora et al. | 414/940 X |
| 5,562,383 | * 10/1996 | Iwai et al. | 414/411 X |
| 5,575,081 | * 11/1996 | Ludwig | 414/940 X |
| 5,674,123 | * 10/1997 | Roberson, Jr. et al. | 414/940 X |
| 5,713,711 | * 2/1998 | McKenna et al. | 414/940 X |
| 5,772,386 | * 6/1998 | Mayes et al. | 414/411 |
| 5,806,574 | * 9/1998 | Yamashita et al. | 414/217 X |

FOREIGN PATENT DOCUMENTS 6-48508 * 2/1994 (JP) ....................................... 414/940

* cited by examiner

Primary Examiner—Douglas Hess
(74) Attorney, Agent, or Firm—Fliesler Dubb Meyer & Lovejoy LLP

(57) ABSTRACT

A system is disclosed for retaining a pod door on a port door at a load port, and for removing contaminants, particulates and/or gasses from between the pod and port door surfaces and from within the interior of the pod door. According to a preferred embodiment of the present invention, a vacuum source may be provided within, adjacent to, or remote from a process tool, which vacuum source is connected to a vacuum port in the front surface of a port door. The vacuum is provided to produce a negative pressure between juxtaposed surfaces of the port and pod doors. The negative pressure accomplishes two functions. First, the negative pressure serves to hold the pod door firmly against the port door to prevent vibration, tilting and/or movement of the pod door with respect to the port door while the pod and port doors are stowed within the process tool. Second, the negative pressure serves to remove particulates, contaminants and/or gasses from between the pod and port doors and from within the interior volume of the pod door.

23 Claims, 6 Drawing Sheets

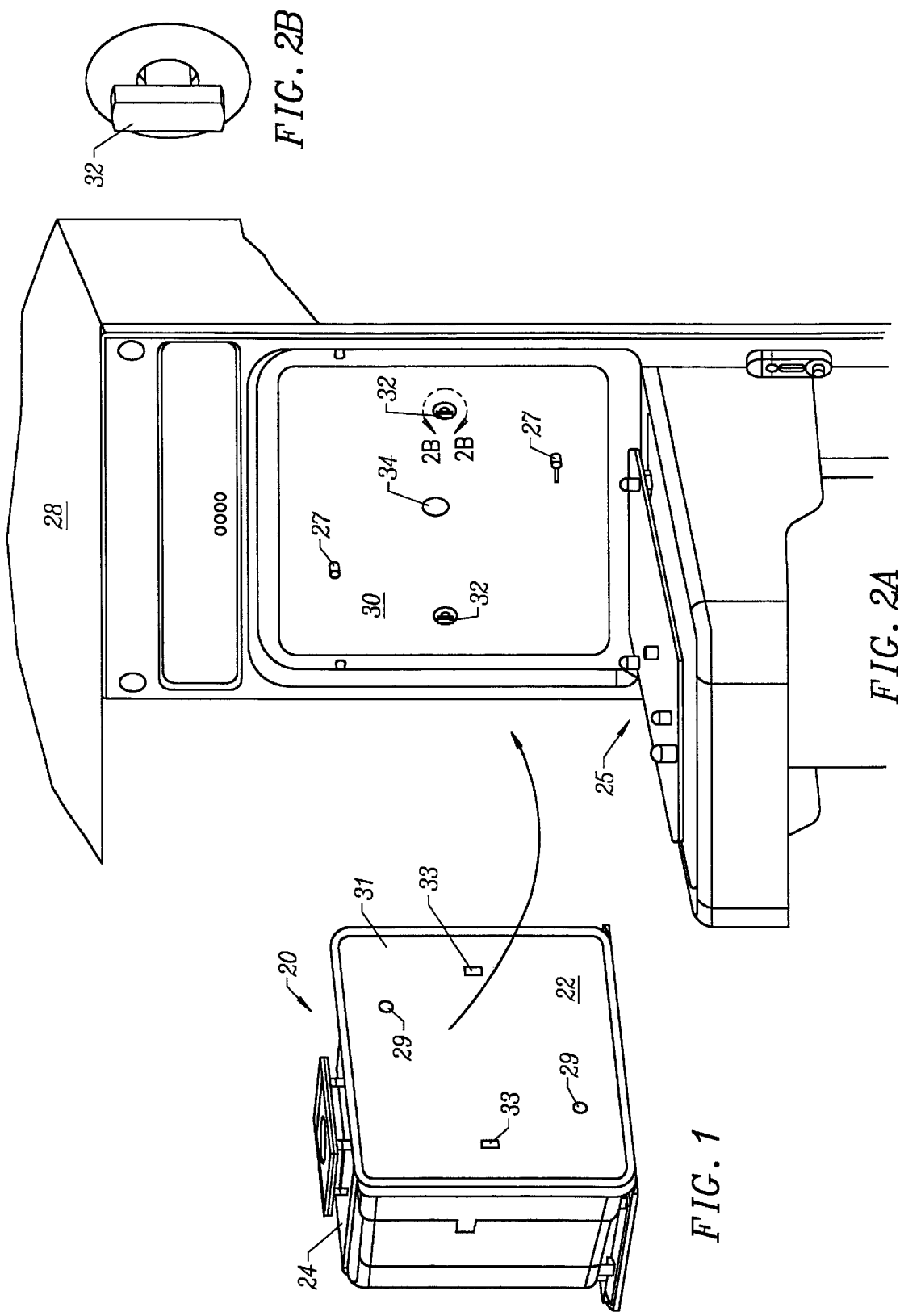

POD TO PORT DOOR RETENTION AND EVACUATION SYSTEM

BACKGROUND OF THE INVENTION

1. Field of the Invention

The present invention relates to the transfer of workpieces such as semiconductor wafers from a storage and transport pod to a process tool, and in particular to a system for ensuring a firm engagement between, and removal of particulates, contaminants and cleanroom air from, the port and pod doors as the pod door is removed from the pod and stowed in the process tool during workpiece transfer between the pod and process tool.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles and molecular contaminants become of interest.

SMIF pods are in general comprised of a pod door which mates with a pod shell to provide a sealed environment in which wafers may be stored and transferred. So called "bottom opening" pods are known, where the pod door is horizontally provided at the bottom of the pod, and the wafers are supported in a cassette which is in turn supported on the pod door. It is also known to provide "front opening" pods, in which the pod door is located in a vertical plane, and the wafers are supported either in a cassette mounted within the pod shell, or to shelves mounted in the pod shell. For both front opening and bottom opening pods, a pod door includes an interior surface which is included as part of the sealed pod environment, and an exterior surface which is exposed to the environment of the wafer fab.

In order to transfer wafers between a SMIF pod and a process tool within a wafer fab, a pod is typically loaded either manually or automatedly onto a load port on a front of the tool. The process tool includes an access port which, in the absence of a pod, is covered by a port door which includes an exterior surface exposed to the wafer fab environment and an interior surface which is part of the sealed environment within the process tool. The SMIF pod is seated on the load port so that the pod door and port door lie adjacent to each other. Registration pins are provided on the port door that mate with holes in the pod door to assure a proper alignment of the pod door with respect to the port door.

Once the pod is positioned on the load port, mechanisms within the port door unlatch the pod door from the pod shell and move the pod door and port door together into the process tool where the doors are then stowed away from the wafer transfer path. The pod shell remains in proximity to the interface port so as to maintain a clean environment including the interior of the process tool and the pod shell around the wafers. A wafer handling robot within the process tool may thereafter access particular wafers supported in the pod for transfer between the pod and the process tool.

It is extremely important to provide a clean environment around the exposed wafers within the process tool. While the air within wafer fabs is typically filtered to some degree, the environment surrounding the process tools and SMIF pods includes relatively high levels of particulates and contaminants as compared to within the pods and tools. As such, significant steps are taken to isolate SMIF pod and process tool interiors from the surrounding environment within the fab.

As explained above, the pod door and port door, even though having surfaces exposed to the environment of the wafer fab, are typically brought into the interior of the process tool in preparation for wafer transfer between the pod and the tool. In order to prevent the particulates and contaminants on the exposed door surfaces from contaminating the interior of the process tool, it is known to hold the exposed pod and port door surfaces against each other when bringing the pod and port doors into the process tools and while the doors are positioned therein. For example, U.S. Pat. No. 4,534,389, entitled "Interlocking Door Latch For Dockable Interface For Integrated Circuit Processing", discloses a spring loaded latch and release cable (FIG. 5 of that Patent) for holding a pod door against the port. Such contact may trap particulates and/or contaminants between the exposed surfaces to thereby prevent the transfer of the particulates and/or contaminants into the process tool.

Coupling mechanisms are known for coupling the pod door to the port door as the pod door is removed from the pod and stowed in the process tool. In addition to these coupling mechanisms, the registration pins fit within registration holes in the pod door to guide the pod door into a proper position on the port door. However, a tolerance is provided between the registration pin and hole to facilitate seating of the pin within the hole without excessive wear. As a result, without additional restraints between the pod and port doors, it is possible that the pod door will vibrate, tilt or move around on the port door. Any such vibration or movement may result in particulates and/or contaminants dislodging from the pod and/or port door surfaces and settling in the process tool.

Prior art attempts have been made to hold the pod door firmly against the port door while the doors are coupled together and stowed in the process tool. Such systems are disclosed for example in U.S. Pat. No. 5,291,923, entitled "Door Opening System and Method", which patent is assigned to IBM, and in U.S. Pat. No. 5,772,386, entitled-"Loading and Unloading Station for Semiconductor Processing Installations", which patent is assigned to Jenoptik A. G. ("the '386 Patent"). As set forth in the '386 Patent for example, the port door includes a pair of suction cups connected to a vacuum source. When the pod door is coupled to the port door, the suction cups engage a portion of the surface of the pod door, and a vacuum source creates suction within the cups to hold the pod door. The cups retract into bore holes to hold the surfaces of the pod door and port door together. The vacuum cups of the '386 Patent engage a small area on the pod door for the purpose of gripping the pod door. The vacuum system of the '386 Patent is unconcerned with removing particulates or contaminants from the pod and port door surfaces.

In conventional systems, as the pod door is positioned adjacent the port door for coupling therewith, it is possible that the pod door may be misaligned with respect to the port door. This misalignment may be caused by one of several contributing factors. In front opening systems, the pod is seated on a support surface on the load port, and the engagement between the pod and the support surface is relied upon to align the pod door to the port door. However, if the pod is warped or manufactured to poor tolerances, the pod door may not precisely align with the port door. Another potential cause of misalignment between the pod and port doors may be that an upstream load port has returned the pod door to the pod in an off-center position with respect to the pod shell.

The port door typically includes registration pins which are intended to align with and fit within registration holes on the juxtaposed surface of the pod door. These registration pins may have spherical tips and/or may be flexibly mounted to the port door (such as for example as disclosed in the '386 Patent) so that as a misaligned pod door is brought to the port door, the registration pins adjust the position of the pod door to be correctly aligned with respect to the port door. Where the misalignment is caused by an upstream load port, it is desirable that the registration pins adjust and correct the position of the pod door so that it may be returned to a centered position with respect to the pod shell. However, where the pod is warped or built to poor tolerances, a pod door may be centered within the pod shell, but it may be misaligned with respect to the port door. In this instance, adjustment of the position of the pod door by the registration pins may result in the pod door being returned to the pod shell in an off-center position, and as a result, the sides of the pod door may scrape against the pod shell. Any such scraping may generate harmful particulates. In prior art systems including port doors that adjust the position of the pod door, the position of the door is adjusted to an expected center position by the registration pins regardless of the cause of the misalignment.

In conventional wafer-carrying pods, as explained above, the pod door typically includes a latch plate assembly and cast walls which define wells and slots for receiving the registration pins and latch keys. Other than these mechanisms, the pod door includes a predominantly hollow interior volume. The outer walls of the pod door typically include one or more openings to the external environment, such as for example at the slots through which the latch plates extend to couple the pod door to the pod shell. Thus, when a pod is first introduced onto the load port of a process tool, the interior volume of the pod door typically includes air from the cleanroom surrounding the minienvironment.

When the pod door is brought into the minienvironment, the cleanroom air from within the interior of the pod door may introduce particulates and contaminants to the minienvironment as the air from within the pod interior diffuses into the minienvironment. This may be particularly harmful where the interior of the minienvironment includes an inert gas or gasses other than air.

SUMMARY OF THE INVENTION

It is therefore an advantage of the present invention to minimize the amount of particulates and contaminants that may escape from between the pod and port doors into the minienvironment of the process tool.

It is another advantage of the present invention to remove particulates and/or contaminants from the exposed pod and port door surfaces.

It is a further advantage of the present invention to purge the air from the interior volume of the pod door.

It is another advantage of the present invention to allow adjustment or no adjustment by the port door of the pod door position relative to the pod shell as desired.

It is a still further advantage of the present invention to provide flexible positioning pins and/or adjustable positioning holes which adjust the position of the pod door while minimizing generation of particulates and/or contaminants in the event adjustment is desired.

It is another advantage of the present invention to flatten out a warped pod door when the pod door is engaged with the port door.

These and other advantages are provided by the present invention which in preferred embodiments relates in general to a system for retaining a pod door on a port door at a load port, and for removing contaminants, particulates and/or gasses from between the pod and port door surfaces and from within the interior of the pod door. According to a preferred embodiment of the present invention, a vacuum source may be provided within, adjacent to, or remote from a process tool, which vacuum source is connected to a vacuum port in the front surface of a port door. The vacuum is provided to produce a negative pressure between juxtaposed surfaces of the port and pod doors. The negative pressure accomplishes two functions. First, the negative pressure serves to hold the pod door firmly against the port door to prevent vibration, tilting and/or movement of the pod door with respect to the port door while the pod and port doors are stowed within the process tool. Second, the negative pressure serves to remove particulates, contaminants and/or gasses from between the pod and port doors and from within the interior volume of the pod door.

The time at which the vacuum is activated relative to the sequence of decoupling the pod door from the pod shell and coupling the pod door to the port door controls whether the position of the pod door is to be adjusted by the port door. In particular, the present invention may be configured to adjust and correct the position of a pod door where a pod door is off-center with respect to a port door as a result of an off-center return of the pod door to the pod shell by an upstream load port. Alternatively, the present invention may be configured not to adjust the position of a pod door where the pod may be warped or otherwise manufactured with poor tolerances. In this event, adjustment of the position of the pod door by the port door to an expected center position may result in the pod door being returned to the port door in an off-center position which can cause scraping of the pod and port doors and particulate generation.

The present invention may further include a perimeter seal mounted on a port door to further enhance the tight engagement between the pod and port doors. The perimeter seal may also include a plurality of gaps to facilitate the flow of gas from around the port and pod doors through the interface between the port and pod doors, and out through the vacuum port.

It is a further feature of the present invention to prevent the cleanroom air within the interior volume of the pod door from diffusing into the minienvironment while the pod door is stowed in the minienvironment. The pod door includes slots and/or holes around its sides and through a surface of the pod juxtaposed to the port door. The vacuum draws air from the interior volume through the holes in the pod surface adjacent the port door and out through the vacuum port. Air from within the minienvironment backfills the interior volume through the holes and slots around the sides of the pod door.

BRIEF DESCRIPTION OF THE DRAWINGS

The invention will now be described with reference to the drawings, in which:

FIG. 1 is a perspective view of a front opening SMIF pod located next to a port door of a process tool;

FIG. 2 is an enlarged perspective view of a portion of the outer surface of a port door including a latch key protruding outwardly therefrom;

DETAILED DESCRIPTION

Figure 3:
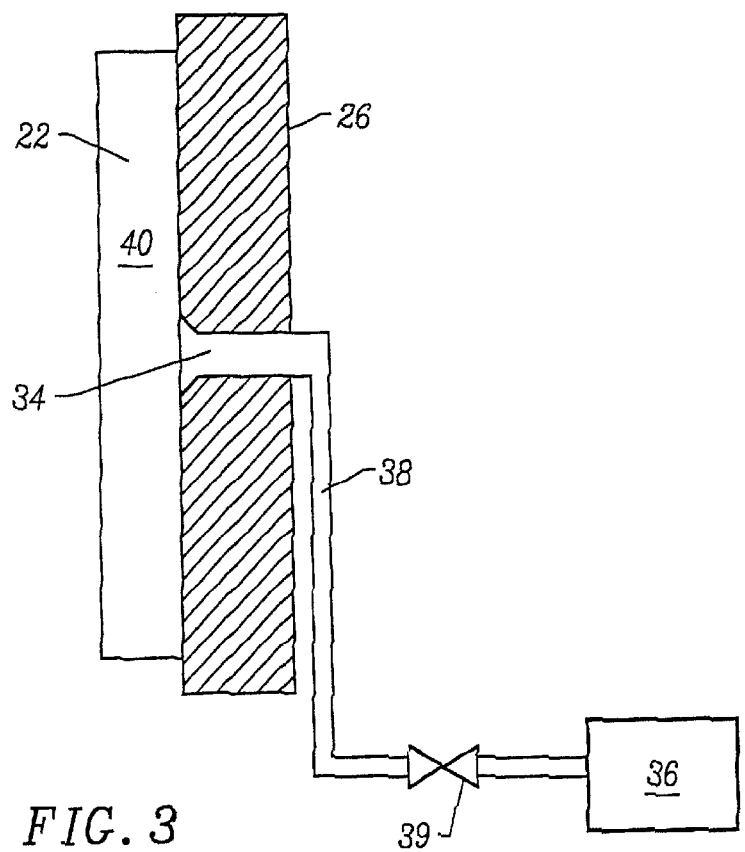
FIG. 3 is a cross-sectional side view of a pod and port door coupled together according to the principles of the present invention.

The present invention will now be described with reference to FIGS. 1–7, which in preferred embodiments relate in general to a system for coupling a pod door to a port door at a load port of a process tool, and for removing particulates, contaminants and/or gasses from the pod and port doors as the pod door is removed from the pod and stowed in the process tool during workpiece transfer between the pod and process tool. While a preferred embodiment of the present invention operates in conjunction with a SMIF pod, it is understood that the present invention may operate with any of various containers. This includes 200 mm and 300 mm SMIF pods, bottom opening and front opening SMIF pods, and pods/boxes that do not operate according to SMIF technology. Additionally, the present invention may operate with containers carrying any of various workpieces, including wafers, reticles, and flat panel displays. The structure according to the present invention complies with and allows compliance with all applicable SEMI standards.

FIG. 1 is a perspective view of a 300 mm front opening SMIF pod 20 including a pod door 22 mating with a pod shell 24 to define a sealed environment for one or more workpieces located therein. (The rear of the pod door 20 would ordinarily be facing the port door as the pod is loaded on the port. It is shown otherwise in FIG. 1 for clarity.) While pod 20 is illustrated as a 300 mm front opening pod, as previously indicated, the size and type of the pod are not critical to the present invention. In order to transfer the workpieces between the pod 20 and a process tool 28, the pod is loaded onto a load port 25 adjacent a port door 26 on a front of the process tool. The type of process carried out within tool 28 is not critical to the present invention, and may be any of various testing, monitoring, and/or processing operations.

Referring now to FIGS. 1 and 2, a front surface 30 of the port door 26 faces a rear surface 31 of the pod door 22, and includes a pair of registration pins 27 for mating within a corresponding pair of registration holes 29. The port door further includes a pair of latch keys 32 for being received in a corresponding pair of slots 33 of a door latching assembly mounted within pod door 22. An example of a door latch assembly within a pod door adapted to receive and operate with latch key 32 is disclosed in U.S. Pat. No. 4,995,430 entitled "Sealable Transportable Container Having Improved Latch Mechanism", to Bonora et al., which patent is assigned to the owner of the present invention, and which patent is incorporated by reference herein in its entirety. In order to latch the pod door to the port door, the pod door 22 is seated adjacent the port door 26 so that the vertically oriented latch keys are received within the vertically oriented slots 33. While a preferred embodiment of the door latch assembly in the pod door has been described above, it is understood that the mechanisms in the pod door for coupling/uncoupling the pod door to the pod shell are not critical to the present invention and may vary significantly in alternative embodiments.

In addition to decoupling the pod door from the pod shell, a 90° rotation, for example, of the latch keys 32 will also lock the keys 32 onto their respective slots 33, thus coupling the pod door to the port door. As would be appreciated by those of skill in the art, alternative latch key configurations are contemplated. One such alternative is disclosed in U.S. patent application Ser. No. 09/115,414, entitled "Pod Door to Port Door Retention System" to Rosenquist et al., which application is assigned to the owner of the present invention and which application is incorporated by reference herein in its entirety. A preferred embodiment of the present invention includes two latch key 32 and slot 33 pairs, each of which pairs are structurally and operationally identical to each other. However, in alternative embodiments of the invention, the pod door may be coupled to the port door by a single latch key and slot pair, or more than two latch key and slot pairs. Moreover, it is understood that where there is more than one latch key/slot pair, the respective pairs need not be identical to each other in alternative embodiments of the invention.

Figure 4A:
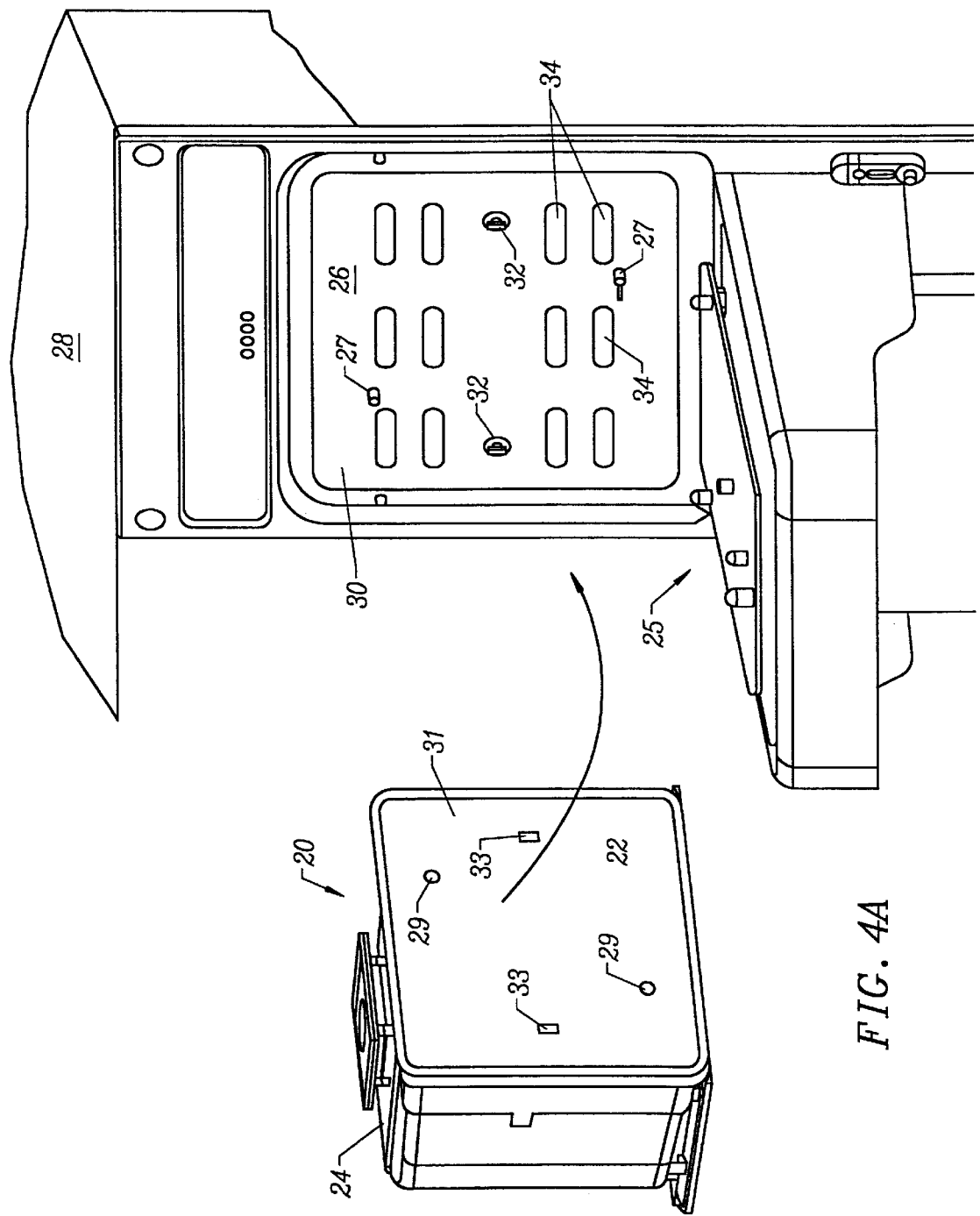
FIG. 4A is a perspective view of a load port and pod showing a plurality of vacuum ports on the port door according to an alternative embodiment of the present invention.
Figure 4B:
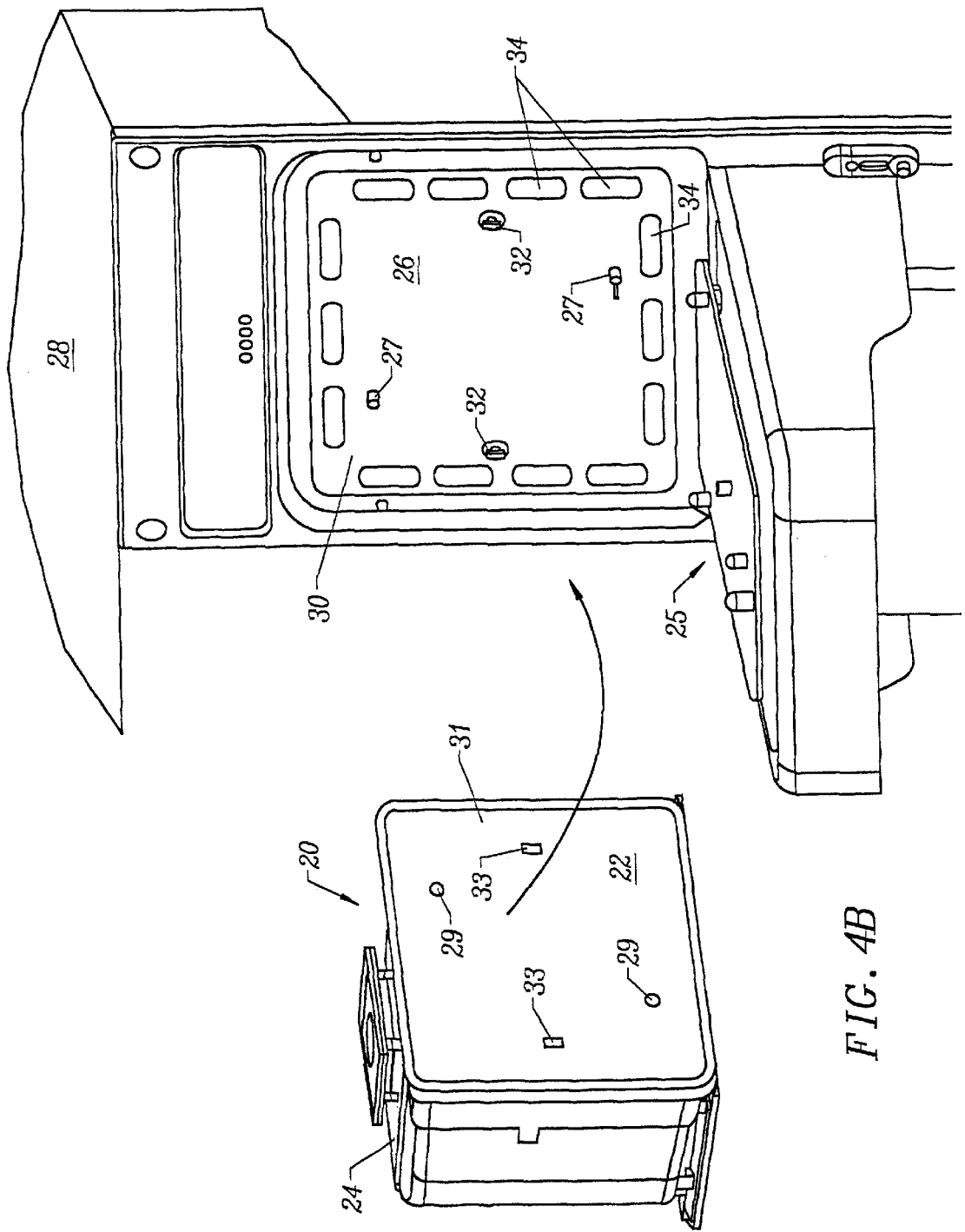
FIG. 4B is a perspective view of a load port and pod showing a plurality of vacuum ports on the port door according to a further alternative embodiment of the present invention.

Referring now to FIGS. 1 and 3, according to a first embodiment of the present invention, the port door further includes a vacuum port 34 formed through the port door and connected to a vacuum source 36 via vacuum line 38. As would be appreciated by those of skill in the art, the vacuum source may be located within or adjacent to each process tool 28, or alternatively may be located remote from the process tool. In this latter embodiment, it is contemplated that a single vacuum source 36 may service a plurality of process tools 28. A valve 39 may further be provided for controlling the negative pressure within the vacuum line 38 and vacuum port 34. In a preferred embodiment of the present invention, port door 26 may include a single, centrally located vacuum port 34 operatively connected to the vacuum source 36 by a single vacuum line 38. However, it is understood that the port door may include a plurality of vacuum ports operatively connected to a vacuum source by a corresponding number of vacuum lines. Two such configurations are shown in FIGS. 4A and 4B. It is understood that the number and position of vacuum ports 34 in the port door may vary significantly in alternative embodiments of the present invention. In a preferred embodiment of the present invention shown in FIG. 3, the vacuum port 34 may have an approximate diameter of ¼ inch. However, it is understood that the size and shape of vacuum port 34 may vary significantly in alternative embodiments of the present invention.

Vacuum port 34, vacuum source 36 and vacuum line 38 are provided to produce a negative pressure between juxtaposed surfaces of the port and pod doors, and for creating a negative pressure within an interior volume 40 of the pod door 22 as explained hereinafter. As this negative pressure is continuously applied as the port and pod doors are removed from the port and stowed in the process tool, the vacuum line 38 must include at least one flexible section along its length so as to be able to move with the port and pod doors as they are removed and stowed. The negative pressure applied by the vacuum source and port accomplishes two functions. First, the negative pressure serves to hold the pod door firmly against the port door to prevent vibration, tilting and/or movement of the pod door with respect to the port door while the pod door is coupled to the port door. Second, even though the pod and port doors are held tightly together, air may still pass between the engaged surfaces of the doors, and the negative pressure at the interface between the port and pod doors draws gas from around the coupled port and pod doors into the interface between the port and pod doors and away from the port and pod doors through the vacuum port. Thus, particulates and/or contaminants are carried by the flow between the port and pod doors and out through the vacuum port. Where particulates and/or contaminants are not drawn away through the vacuum port 34, they are at least prevented from escaping from between the port and pod doors by the flow of gas in the opposite direction.

In one embodiment of the present invention, the vacuum source may draw gas away under a pressure of 5 lbs. per square inch at the interface between the port and pod doors. As the surface area between the port and pod doors may be approximately one square foot or 144 square inches, the vacuum source may hold the pod and port doors together with approximately 720 lbs. of force. As indicated in the Background of the Invention section, the pod door may be warped. The pound-force generated by the vacuum source will flatten the pod door against the port door when coupled therewith. This further prevents any movement of the pod door with respect to the port door while coupled together. Additionally, while the pod may return at least to some extent to its warped state after decoupling from the port door, the pod door remains flat against the port door while the pod door is returned to the pod shell. This lessens the likelihood of contact between the pod door and the pod shell upon return of the pod door to the pod.

As explained in the Background of the Invention section, it is desirable to be able to control whether the port door adjusts the position of the pod door upon decoupling from the pod shell. In particular, where a pod door is off-center with respect to a port door as a result of an off-center return of the pod door to the pod shell by an upstream load port, it is desirable to adjust the position of the pod door to a centered position upon return of the pod door to the pod shell. On the other hand, where the pod may be warped or otherwise manufactured with poor tolerances, a pod door may be centered with respect to the pod shell, but off-center with respect to the port door. In this instance, adjustment of the position of the pod door by the port door to an expected center position may result in the pod door being returned to the port door in an off-center position. This can cause scraping of the pod door against the pod shell and particulate generation. It is therefore a feature of the present invention to allow a wafer fab technician to adjust the position of a pod door to the port door, or not to adjust the position of the pod door to the port door, as desired. In particular, if the vacuum source 36 is activated before the pod door is released from the pod shell, the vacuum will pull the pod door toward the port door before the pod is released by the pod shell. Upon release of the pod door from the pod shell, there is at most a very small space between the pod and port doors. As such, upon release of the pod door from the pod shell, the pod door will be pulled tight against the port door before the registration pins 27 are able to adjust the lateral position of the pod door.

If on the other hand the vacuum source is only activated after the pod door is released and separated from the pod shell, the registration pins 27 will have a chance to adjust the position of the pod door to a position at which the pod door is centered with respect to the port door before the vacuum pulls the pod door straight in. Therefore, where a fab technician determines that the pods may be warped or otherwise built to poor tolerances, no adjustment of the position of the pod door by the port door is preferred, and the technician may cause the control system to activate the vacuum source before the latch keys decouple the pod door from the pod shell. On the other hand, where a fab technician determines that an upstream load port is returning pod doors to the pod shells in an off-center position, and positional adjustment of the pod door is desired, the technician may cause the control system to activate the vacuum source after the pod door is decoupled from the pod shell to thus accomplish the positional correction.

It is thus understood that the vacuum source may be activated before, during or after decoupling and separation of the pod door from the pod shell in embodiments of the invention. There may also be other criteria than a warped pod or faulty upstream load port for determining whether the present invention allows or does not allow positional adjustment of the pod door. Additionally, embodiments of the present invention may be provided to either correct or not to correct the position of the pod door, without the ability to switch between the two options. In an embodiment where the vacuum is turned on prior to the pod door being released from the pod shell, and no option to adjust the position of the pod door is provided, the registration pins may be undersized, or omitted altogether.

In embodiments of the present invention configured to always adjust the pod door position, or to provide the option to adjust or not to adjust the pod door position, the registration pins may be mounted in the port door to be able to shift as explained hereinafter so as to facilitate seating in the registration holes when the pins and holes are not precisely aligned. Alternatively, rigid pins may be mounted to a flexible base to allow the pins to bend. Further still, the pins may be flexible along their length. The tip of the registration pins are preferably spherical or tapered to facilitate receipt of the pins within the holes for off-center alignments.

Figure 5:
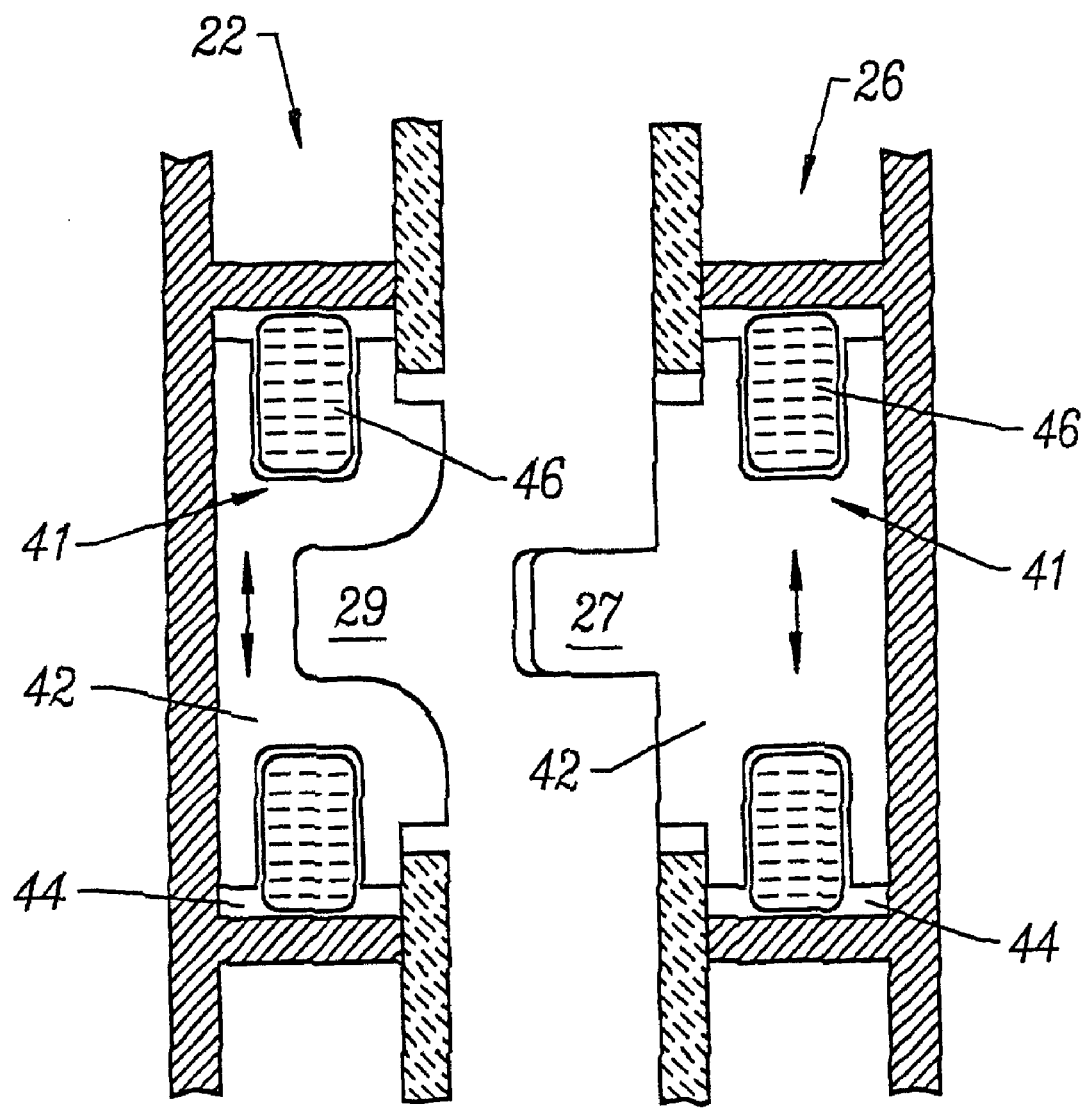
FIG. 5 is a cross-sectional side view of a flexible registration pin hole mounted within the pod door.

Referring now to FIG. 5, both the registration pin 27 and the registration hole 29 may be spring loaded in the port door and pod door, respectively, to add further flexibility to the registration pin and hole mating, and to further reduce the potential for particulate generation. As shown in the alternative embodiment of FIG. 5, the port door and the pod door may each include a floating registration assembly 41. Each of the floating registration assemblies 41 include a floating member 42 translatably mounted within a slot 44 formed within the respective port and pod doors. The registration pin 27 is formed in the floating member 42 of the port door registration assembly 41, and the registration hole 29 is formed in the floating member 42 of the pod door registration assembly 41. A memory free elastomeric member 46 is provided around the floating member 42 in each assembly 41 so that outer edges of each elastomeric member 46 engage the walls of slot 44, and inner edges of each elastomeric member 46 engage the floating members 42.

With such a configuration, the elastomeric members 46 serve to maintain the floating members 42 in a centered position within slots 44 in each of the assemblies 41. However, in the event the registration pin is not perfectly aligned with the registration hole, engagement of the registration pin with a side wall of the registration hole will deflect the floating member 42 in the port door and/or the floating member 42 in the pod door against the force of the elastomeric member 46 to allow the registration pin to properly seat within the registration hole with minimal wear. The side walls of the floating member defining the registration hole, as well as the tip of the registration pin, may be tapered to facilitate receipt of the registration pin within the registration hole.

The elastomeric members 46 are preferably memory free so that upon removal of the registration pin from the registration hole, the elastomeric members return to their original shape to center the respective floating members 42 within slots 44. The elastomeric members 46 may be sized and have sufficient stiffness to support the weight of the pod door on the registration pins with minimal deflection of the respective assemblies 41, while allowing deflection for a misalignment between the registration pin and registration hole. In a preferred embodiment, the floating members are circular when viewed from the front, and the elastomeric members 46 are preferably annular. With such a configuration, each elastomeric members 46 allow adjustment of the floating members 42 in all radial directions. It is understood that the floating members 42 and the elastomeric members 46 may have other configurations. It is also contemplated that the configuration of the pod door floating registration assembly need not be the same as the port door floating registration assembly.

While FIG. 5 shows both the pod and port doors including a floating registration assembly 41, it is understood that one or the other of the pod doors may include assemblies 41 as described above in alternative embodiments. In a further alternative embodiment to that shown in FIG. 5, various springs may be used in the place of the elastomeric members 46 to bias the floating members 42 to a center position within slots 44 while allowing adjustment of one or both of the respective floating members upon a misalignment between the registration pin and registration hole. In a still further alternative embodiment, the elastomeric member 46 in the pod door may have a thinner profile at its bottom than at its top. Such a configuration will cause the unbiased position of the floating member 42 in the pod door to be toward the bottom of slot 44. Thus, when the registration pins seat within the registration holes, the larger top portion of the elastomeric member will counter balance the weight of the pod door (which would tend to bias the floating member 42 in the pod door upward within slot 44) so that the floating member 42 in the pod door would then be centered within the slot. The same may be accomplished by providing the elastomeric member 46 in the port door with a thinner profile at its top than at its bottom.

Figure 6:
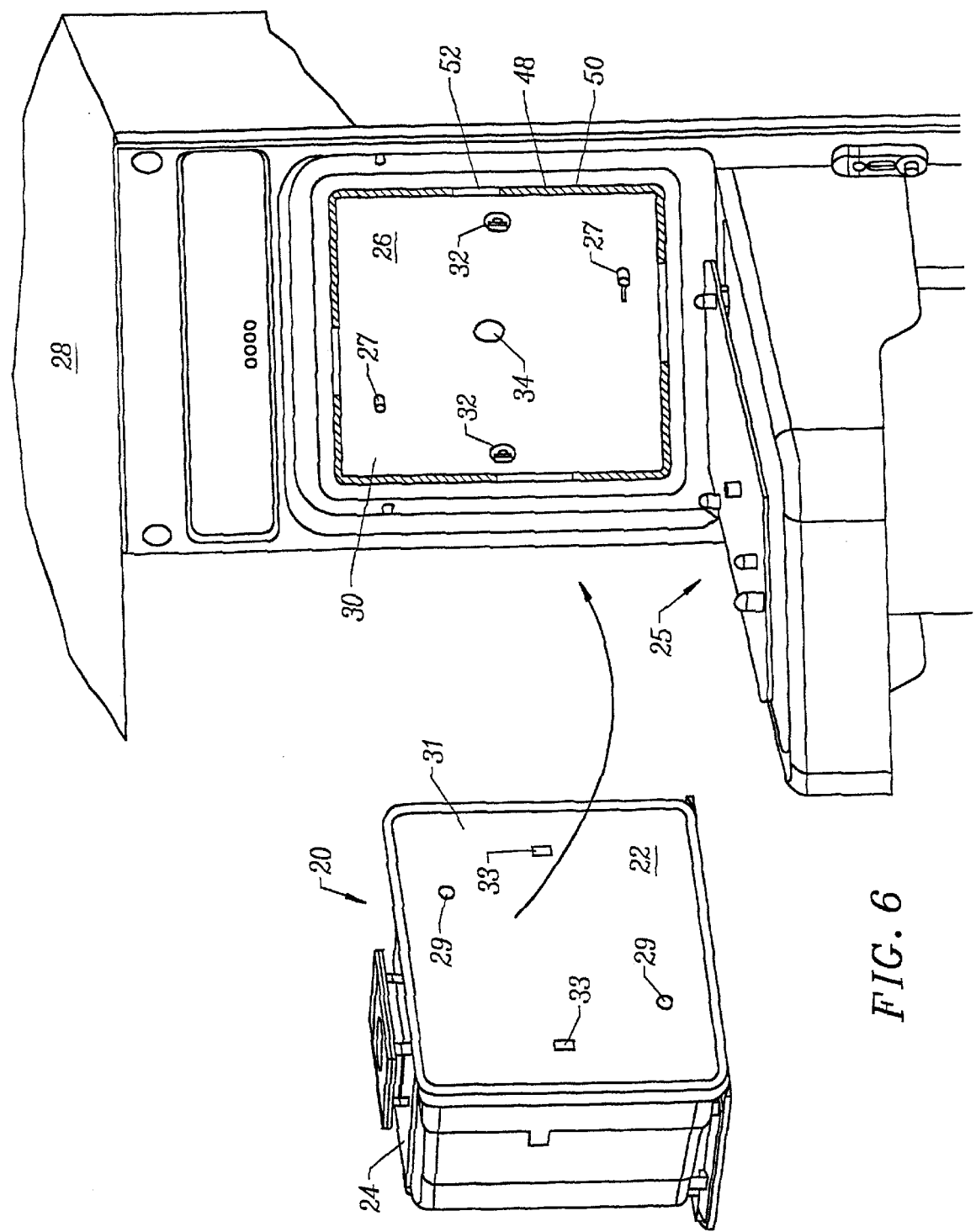
FIG. 6 is a perspective view of a port door and a pod door including a perimeter seal according to an alternative embodiment of the present invention.

Referring now to FIG. 6, in addition to the one or more vacuum ports 34, a perimeter seal 48 may be mounted within a channel 50 formed within an outer perimeter of the port door. The perimeter seal 48 may be provided to enhance the seal between the port and pod doors generated by the vacuum source 36 and vacuum port 34. In a preferred embodiment, the perimeter seal may be formed of Viton or other elastomer, and have a circular cross-section with an outer diameter of between one-eighth and one-quarter inches. It is understood that the materials and dimensions of the perimeter seal may vary in alternative embodiments. The perimeter seal resides in the channel 50 so that a small portion of the perimeter seal extends out beyond the plane of the port door surface by, for example, approximately 50 mils. As the port and pod doors come together, the pod door compresses the perimeter seal 48 to establish a tight seal along the line of contact between the perimeter seal 48 and the pod door, while at the same time allowing the surfaces of the port and pod doors to lie flush against each other.

As shown in FIG. 6, the perimeter seal may include one or more gaps 52 around its perimeter through which air from the minienvironment may be drawn by the vacuum source 36. The gaps 52 may be evenly dispersed around the perimeter seal, or may have a higher concentration in a particular area. For example, a higher number of gaps 50 may be provided along the bottom portion of a perimeter seal so that particulates may fall from between the surfaces of the port and pod doors due to the force of gravity before the doors are brought into the minienvironment and before the vacuum source is activated.

It is understood that the configuration of the perimeter seal 48 and channel 50 may vary in alternative embodiments, and that the cross-sectional configuration of the perimeter seal 48 may also vary in alternative embodiments. For example, the perimeter seal 48 need not be hollow. As a further alternative, the perimeter seal may comprise a flap projecting at an angle from channel 50.

Figure 7:
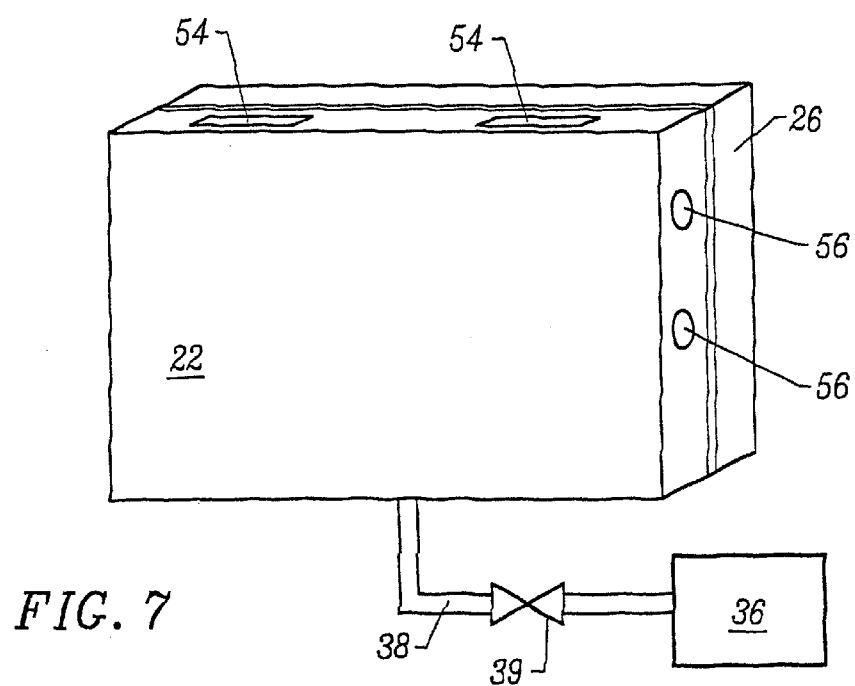
FIG. 7 is a perspective view of the pod door affixed to the port door according to the present invention.

As discussed above, the pod door 22 includes an interior volume 40 which houses the door latching assembly and includes various ridges and walls which define the holes for receiving the registration pins and latch keys. Aside from these structures, the interior volume 40 is predominantly hollow. As shown in FIG. 7, the volume 40 is open to the environment surrounding the pod door at least at the slots 54 through which the latch plates of the latch assembly extend to couple the pod door to the pod shell. Other openings such as for example holes 56 may be provided through the pod door to open the interior volume 40 of the pod door to the external environment. These slots and holes may be located on the sides of the pod and on the rear surface 31 as explained hereinafter. No such holes or slots are provided on a surface of the pod door adjacent to the wafer-containing interior of the pod.

With the various slots 54 and holes 56, when a pod 20 is initially loaded onto a load port 25 of a process tool 28, the interior volume 40 is filled with air from the cleanroom. Air from the cleanroom includes considerably more particulates and/or contaminants than the atmosphere within the minienvironment, and it would be desirable to prevent the air within the interior volume 40 to diffuse into the minienvironment. As indicated in the Background of the Invention section, diffusing of the air from the interior volume 40 into the minienvironment may be an especially big problem where the interior of the minienvironment is filled with an inert gas or some composition other than air.

According to the present invention, air from within the interior volume 40 of the pod door is prevented from diffusing into the minienvironment as a result of the negative pressure established by the vacuum source through the vacuum port 34. In particular, the rear surface 31 of the pod door in contact with the port door includes holes which open interior volume 40 to the low pressure at the interface between the port and pod doors. Thus, the air from within the interior volume is drawn out of the interior volume and is removed through the vacuum port 34. Additionally, it is common to put the pod door and/or shell through a cleaning process which may result in moisture being left within the interior volume 40. According to the present invention, any such moisture is additionally prevented from entering the minienvironment.

The holes through to the interior volume within the pod door may be at the holes and slots for the registration pins and latch keys, respectively, or may additionally or alternatively be located elsewhere in the rear surface 31. As the air from within the interior volume 40 is drawn out through the vacuum port 34, gas from within the minienvironment backfills the interior volume 40 through the slots and/or holes 54, 56.

The present invention prevents diffusion of air within the interior volume of the pod door into the minienvironment without having to seal the interior volume against the surrounding environment. This configuration provides a greatly simplified construction relative to conventional pod doors which have attempted to provide a sealed, isolated interior volume within the pod door. Such conventional configurations are difficult to manufacture with high tolerances, in part because the wells and slots for receiving the registration pins and latch keys must be formed in the rear cover plate of the pod door, which is formed and then subsequently attached to the pod door. The problem with such constructions is that the cover plate may be affixed in different positions on the pod door due to manufacturing tolerances. An imprecise positioning of the cover plate in the pod door will result in the pod door being positioned off-center on the port door when coupled therewith (even though the cover plate is properly positioned). This in turn may result in the pod door rubbing against the pod shell as the pod door is returned to the shell.

By contrast, because there are no considerations regarding having to seal the interior volume against the surrounding environment in the present invention, the holes and slots for the registration pins and latch keys may be formed directly in the pod door as opposed to the rear cover plate. Thus, the pod door (as opposed to the cover plate) directly registers against the port door. This increases the likelihood that the pod door will be centered with respect to the pod shell as the pod door is returned to the shell.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A load port, capable of being affixed to a process tool, for receiving a pod carrying one or more workpieces, the pod including a pod shell and a pod door mating with the pod shell, the load port facilitating transfer of the one or more workpieces between the pod and the process tool, the load port comprising:
   a port through which the one or more workpieces may be transferred;
   a port door movable between a first position where said port door covers said port, and a second position where said port door allows said workpieces to be transferred through said port, said port door including means for coupling said port door to the pod door, an interface being defined between said coupled port door and pod door said interface having an area approximately equal to the area of the side of the pod door juxtaposed to said port door;
   a vacuum source operatively connected to said port door for generating a negative pressure relative to ambient pressure across substantially said entire interface.

2. A load port as recited in claim 1, wherein said vacuum source holds the pod door firmly against said port door.

3. A load port as recited in claim 1, wherein said vacuum source removes particulates and/or contaminants from between said port door and the pod door.

4. A load port as recited in claim 1, wherein said vacuum source removes air from within the pod door.

5. A load port as recited in claim 1, wherein said vacuum source removes moisture from within the pod door.

6. A load port assembly, including a port door covering a load port, for receiving a container having one or more workpieces therein, the container including a shell and a door mating with the shell, the load port assembly facilitating transfer of the one or more workpieces to and from the container upon decoupling the container door from the container shell and coupling of the container door to the port door, the load port assembly comprising:
   a vacuum generation system capable of removing particulates from substantially an entire interface between the port door and container door upon coupling of the port door and container door, said vacuum generation system including:
   a vacuum source for generating a negative pressure relative to an environment surrounding the port door and container door, and
   a connector connected between said vacuum source and at least one section of the port door for communicating said negative pressure to substantially all of said interface.

7. A load port assembly as recited in claim 6 wherein said at least one section comprises a single section centrally located on the port door.

8. A load port assembly as recited in claim 6 wherein said at least one section comprises a plurality of sections generally evenly spaced across a surface of the port door.

9. A load port assembly as recited in claim 6 further comprising an elastomeric seal provided around said interface.

10. A load port assembly as recited in claim 6 wherein the container comprises a SMIF pod.

11. A load port assembly, including a port door covering a load port, for receiving a container having one or more workpieces therein, the container including a shell and a door mating with the shell, the container door including a first registration feature, the load port assembly facilitating transfer of the one or more workpieces to and from the container upon decoupling the container door from the container shell and coupling of the container door to the port door, the load port assembly comprising:

a vacuum source for generating a negative pressure relative to an environment surrounding the port door and container door capable of removing particulates from substantially the entire interface between the port door and the container door; and a connector connected between said vacuum source and at least one section of the port door for communicating said negative pressure to substantially the entire interface between the port door and the container door.

12. A load port assembly as recited in claim 11, further comprising:

a second registration feature provided on the port door, the first registration feature and said second registration feature capable of mating with each other to align the container door with the port door.

13. A load port assembly as recited in claim 12, wherein the decoupling of the container door from the container shell is coordinated with an application of said negative pressure to said interface to control an amount by which an off-center position of the container door with respect to the port door, is corrected.

14. A load port assembly as recited in claim 12, wherein at least one of said first and second registration features is capable of occupying first and second distinct positions.

15. A load port assembly, including a port door covering a load port, for receiving a container having one or more workpieces therein, the container including a shell and a door mating with the shell, the container door including an interior space, the load port assembly facilitating transfer of the one or more workpieces to and from the container upon decoupling the container door from the container shell and coupling of the container door to the port door, the load port assembly comprising:

a vacuum source for generating a negative pressure relative to an environment surrounding the port door and container door; and a connector connected between said vacuum source and at least one section of the port door for communicating said negative pressure to substantially the entire interface between the port door and the container door, and for communicating said negative pressure to the interior space within the container door.

16. A load port assembly as recited in claim 15 wherein said at least one section comprises a single section centrally located on the port door.

17. A load port assembly as recited in claim 15 wherein said at least one section comprises a plurality of sections generally evenly spaced across a surface of the port door.

18. A load port assembly as recited in claim 15 further comprising an elastomeric seal provided around said interface.

19. A load port assembly as recited in claim 15 wherein the container comprises a SMIF pod.

20. A load port assembly, including a port door covering a load port, for receiving a container having one or more workpieces therein, the container including a shell and a door mating with the shell, the load port assembly facilitating transfer of the one or more workpieces to and from the container upon decoupling the container door from the container shell and coupling of the container door to the port door, the load port assembly comprising:

a vacuum source operatively connected substantially to an entire interface between the port door and the container door, said vacuum source generating a flow of gas from said interface to said vacuum source when the port door is coupled to the container door to remove particulates from substantially the entire interface between the port door and the container door.

21. A load port assembly as recited in claim 20, wherein the port door includes one of a registration pin and a registration slot, and the container door includes the other of said registration pin and said registration slot, the registration pin and registration slot capable of mating with each other to align the container door with the port door.

22. A load port assembly as recited in claim 21, wherein the decoupling of the container door from the container shell is coordinated with an initiation of said gas flow to control an amount by which an off-center position of the container door with respect to the port door, is corrected.

23. A load port assembly as recited in claim 21, wherein at least one of said registration pin and said registration slot is capable of occupying first and second distinct positions.

* * * * *